United States Patent [19]
Fan et al.

[11] Patent Number: 5,254,950
[45] Date of Patent: Oct. 19, 1993

[54] DC SUPERCONDUCTING QUANTUM INTERFERENCE DEVICE USABLE IN NUCLEAR QUADRUPOLE RESONANCE AND ZERO FIELD NUCLEAR MAGNETIC SPECTROMETERS

[75] Inventors: Non Q. Fan, San Diego; John Clarke, Berkeley, both of Calif.

[73] Assignee: The Regents, University of California, Oakland, Calif.

[21] Appl. No.: 759,997

[22] Filed: Sep. 13, 1991

[51] Int. Cl.[5] .............................................. G01V 3/00
[52] U.S. Cl. .................................................... 324/322
[58] Field of Search ................ 330/61 R, 60, 62; 307/306; 505/855; 324/300, 318, 322

[56] References Cited

U.S. PATENT DOCUMENTS

| | | | |
|---|---|---|---|
| 4,585,999 | 4/1986 | Hilbert et al. | 505/855 |
| 4,638,257 | 1/1987 | McDonald | 505/855 |
| 4,733,182 | 3/1988 | Clarke et al. | 324/322 |

FOREIGN PATENT DOCUMENTS 0281090  11/1988  Japan ................................ 505/855

*Primary Examiner*—Louis Arana
*Attorney, Agent, or Firm*—Paul R. Martin; Kathleen S. Moss; Pepi Ross

[57] ABSTRACT

A spectrometer for measuring the nuclear quadrupole resonance spectra or the zero-field nuclear magnetic resonance spectra generated by a sample is disclosed. The spectrometer uses an amplifier having a dc SQUID operating in a flux-locked loop for generating an amplified output as a function of the intensity of the signal generated by the sample. The flux-locked loop circuit includes an integrator. The amplifier also includes means for preventing the integrator from being driven into saturation. As a result, the time for the flux-locked loop to recover from the excitation pulses generated by the spectrometer is reduced.

2 Claims, 5 Drawing Sheets

DC SUPERCONDUCTING QUANTUM INTERFERENCE DEVICE USABLE IN NUCLEAR QUADRUPOLE RESONANCE AND ZERO FIELD NUCLEAR MAGNETIC SPECTROMETERS

BACKGROUND OF THE INVENTION

This invention was made under Contract No. DE-AC03-76SF00098 between the U.S. Department of Energy and the University of California for the operation of Lawrence Berkeley Laboratory. The Government has certain rights in this invention.

FIELD OF THE INVENTION

This invention relates generally to spectrometers. More specifically, the invention relates to a spectrometer for the direct measurement of the nuclear quadrupole resonance and the zero field nuclear magnetic resonance of a sample.

Spectrometers have been developed to measure the wavelengths and intensities of radiative energy arising from transitions between different energy states in matter. It is known that atomic and molecular species can attain discrete energy levels or states. A transition between these energy states leads to emission or absorption of a characteristic quantum of energy. The properties of these characteristic emissions or absorptions are closely related to the identity and to the structure of atoms and molecules. As a result, plots of these transition frequencies, called spectra, furnish important information about molecular structure and composition of a sample. Examples of spectrometers are gamma ray spectrometers for measuring nuclear transitions and disintegrations, ultraviolet and visible light spectrometers for measuring the excitation of valence electrons, infrared and microwave spectrometers for measuring molecular vibrations and rotation, microwave spectrometers for measuring electron spin resonances, and radio frequency spectrometers for measuring nuclear magnetic resonances.

It is desirable to measure the transitions between states separated by small energy differences resulting from weak interactions between the nuclei in a sample. The frequencies of these signals may be low, typically, below 200 kHz, but sometimes extending to 2 MHz. Consequently, it is desirable to have spectrometers which can measure signals having frequencies typically in the range 0-2 MHz, preferably in the range 0-1 MHz, more preferably in the range 0-200 kHz and most preferably in the range 0-50 kHz.

Typically, a nuclear magnetic resonance (NMR) spectrometer is used to measure the low frequency signals. NMR is a phenomenon exhibited by a large number of atomic nuclei which is based upon the existence of nuclear magnetic moments associated with quantized nuclear spins. These nuclear moments, when placed in an external magnetic field, give rise to distinct nuclear transition energy levels which can be induced by the application of a suitable radio-frequency radiation, typically in the megahertz range. The absorption of the radio-frequency radiation and its subsequent re-emission can be detected by a suitable radio-frequency receiver. The frequency of the radio-frequency radiation is proportional to the magnitude of the external magnetic field.

Prior art nuclear magnetic resonance spectrometers have difficulty in measuring low frequency signals. This is because the power of the radio frequency signal generated by a sample and coupled to a spectrometer typically varies as the cubic power of the frequency. As the frequency decreases, the power coupled to the spectrometer decreases drastically.

The spectra of two types of weak interactions, the nuclear quadrupole resonance (NQR) spectra and the zero-field NMR (ZFNMR) spectra, are especially useful in providing important information relating to a sample. NQR spectra arise from the interaction of the electric quadrupole moment of a nucleus having spin $I \geq 1$ with the local electric field gradient around the nucleus. No external magnetic field is required to generate the NQR spectra. The frequencies of the spectra are low because the nuclear quadrupole interaction is weak. ZFNMR spectra arise from the interaction of a nuclear spin with the local magnetic field generated by spins of neighboring nuclei. Again, no external magnetic field is required to generate the ZFNMR spectra. The frequency of the ZFNMR spectra is low because the strength of the local magnetic field is low, typically below 1 mtesla, compared to the strength of an external applied magnetic field.

Condensed matter physics and chemistry are two of the important areas where the detection of low frequency NQR spectra and ZFNMR spectra are of considerable interest. One example is the detection of deuterons ($^2D$) using NQR which provides information about organic molecules in which protons are selectively replaced by deuterons. Other examples include the detection of the NQR spectra of $^5Be$, $^{11}B$ and $^{14}N$ in nearly symmetric environments. A further example is the detection of the ZFNMR spectra of water molecules in hydrated crystals having a resonance frequency of about 42 kHz.

Another possible application of detecting low frequency NMR is in the area of oil well lodging. An NMR detector could be positioned inside a bore hole in an oil well. An external magnetic field pulse would then be intially applied to a sample and then the field would be turned off. The spectra resulting from the precession of the magnetic moment of proton about the magnetic field of the earth would then be detected. The frequency of the spectra is low, about 2 kHz, because the magnetic field of the earth is weak.

Another possible application of detecting the NQR spectra is the detection of the presence of a plastic bomb. Prior art detection methods have difficulty in detecting the presence of nitrogen nuclei, an essential ingredient of an explosive compound, in the chemical environment typically found in a plastic bomb. It has been found that the nitrogen nucleus in such a chemical environment emits a characteristic NQR spectra which could be used to detect the presence of a plastic bomb.

The frequency ranges of the NQR and ZFNMR spectra, described above, are low, typically, but not necessarily, below 200 kHz. Since prior art NMR spectrometers have difficulty in detecting such spectra, there is a need to develop a new spectrometer which is able to detect the low frequency NQR and ZFNMR spectra.

Summary of the Invention

The present invention provides a dc superconducting quantum interference device usable in spectrometer for detecting the intensity of a radio frequency signal arising from the nuclear quadrupole resonance or the zero-field nuclear magnetic resonance spectra generated by a sample. The spectrometer would be comprised of a means for generating a radio frequency excitation pulse and a transmitter coil for coupling the radio frequency excitation pulse to the sample. The spectrometer would also incorporate an amplifier for generating an amplified output as a function of the intensity of the radio frequency signal generated by the sample. The spectrometer would further incorporate a means for coupling the radio frequency signal generated by the sample to the amplifier. The amplifier comprises a dc SQUID operating in a flux-locked loop, and the flux-locked loop comprises an integrator. The spectrometer also comprises a means for preventing the integrator from being driven into saturation by the excitation pulse.

The present invention facilitates a method for detecting the intensity of a radio frequency signal arising from the nuclear quadrupole resonance or the zero-field nuclear magnetic resonance spectra generated by a sample. The method comprises the step of generating a radio frequency excitation pulse and coupling the radio frequency excitation pulse to the sample. Following termination of the excitation pulse, the radio frequency signal generated by the sample in response to the excitation pulse is coupled to an amplifier having a dc SQUID operating in a flux-locked loop. The flux-locked loop comprises an integrator. The integrator is prevented from being driven into saturation by the excitation pulse. The method also comprises the step of generating, using the amplifier, an amplified output as a function of the intensity of the radio frequency signal generated by the sample.

DETAILED DESCRIPTION OF THE INVENTION

Figure 1:
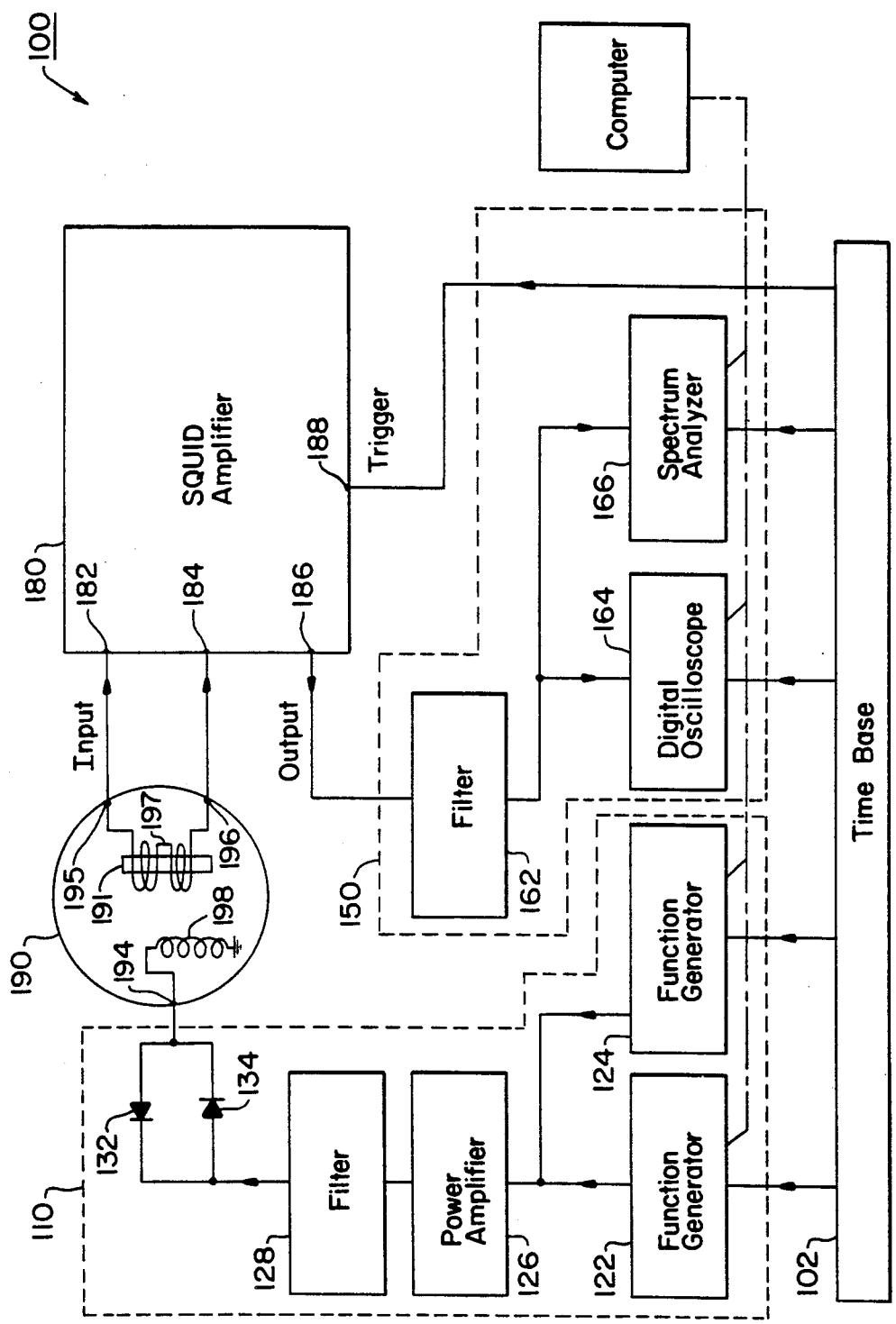
FIG. 1 is a block diagram of a spectrometer for detecting low frequency nuclear quadrupole resonance and zero-field nuclear magnetic resonance according to the present invention.

The spectrometer according to the present invention is able to detect nuclear quadrupole resonance (NQR) arising from the interaction of electric quadrupole moment of a nucleus having spin $I \geq 1$ with the local electric field, and zero-field nuclear magnetic resonance (ZFNMR) arising from the interaction of a nuclear spin with the local magnetic field generated by spins of neighboring nuclei. The frequency of these spectra is typically but not necessarily below 200 kHz. The major difficulty in observing resonance signals at a low frequency, f, is their small amplitude. At a given temperature, the power coupled to a tuned circuit with quality factor Q is $Qf^3$. Consequently, the power available to an amplifier at low frequencies is many orders of magnitude lower than the power from high-frequency resonances at, for example, 10's of MHz typically measured by prior art nuclear magnetic resonance (NMR) methods. Because of this difficulty, prior art methods attempt to detect the low-frequency NQR and ZFNMR indirectly.

One of the prior art methods for indirectly detecting the low frequency NQR is to derive the quadrupole interactions from a high-field NMR spectrum. This technique usually requires using a single crystal as a sample. This is because if a powder sample is used, much of the quadrupole information may be lost because of the broadening of the high field NMR spectrum by powder averaging. An alternative indirect method which enables one to obtain high resolution NQR and ZFNMR spectra from powder samples is magnetic field cycling. This technique, however, determines the zero-field free induction decay (FID) signal point by point. Since only one point is obtained from each field cycling process, this technique is typically very time consuming. In addition, this technique requires the sample to have a long longitudinal relaxation time to ensure that the field cycling process is adiabatic. More recently, a third indirect method of observing ZFNMR has been introduced in which the sample is rotated rapidly in a high magnetic field and appropriate sequences of radio frequency pulses are applied. However, this technique has not yet been applied to the detection of NQR.

Compared with indirect detection techniques, described above, direct detection of NQR and ZFNMR, i.e., measuring the low frequency signal generated by a sample following its excitation by a radio frequency pulse, has several advantages. It allows the use of powder samples. The spectra can also be obtained more quickly, since the entire FID signal is obtained in a single measurement. It also enables easy implementation of two-dimensional spectra techniques.

However, it is not easy to directly detect the low frequency NQR and ZFNMR signals. Direct detection requires an extremely low-noise amplifier, as explained above. Furthermore, the transverse relaxation time in a solid is short so that the amplifier must recover very quickly from the radio frequency pulse that initiates the FID. In addition, in order to excite all the resonances over a large bandwidth with a single magnetic pulse, the pulse length must be short and consequently of large amplitude. This requirement compounds the difficulties of a short recovery time because the recovery time of an amplifier increases as the amplitude of the pulse increases.

A dc SQUID, correctly configured and operated, is by far the most sensitive amplifier in the frequency range of interest. A dc SQUID is a device comprising a superconducting ring and a pair of Josephson junctions which converts magnetic flux into electrical signal. In order to use a dc SQUID to detect NQR and ZFNMR, it is desirable for the SQUID-based amplifier to satisfy three major criteria. First, the sensitivity must be as high as possible in order to detect signals at low frequency. Second, the bandwidth should extend to at least 200 kHz and preferably to higher frequencies so that most of the $^2D$ NQR spectra, the detection of which has practical interest, can be covered. Third, the amplifier should be able to recover quickly, preferably in a few tens of microseconds, after the magnetic pulse has been turned off in order to detect signals from a sold sample having a short transverse relaxation time.

The use of a dc SQUID operated in a flux locked loop to study low frequency NMR has been disclosed by Friedman et al. in Rev. Sci. Instrum. 57 (3), March 1986, pp. 410 et. seq. However, this publication does not disclose a dc SQUID amplifier which is suitable for use in the detection of NQR and ZFNMR.

Figure 2:
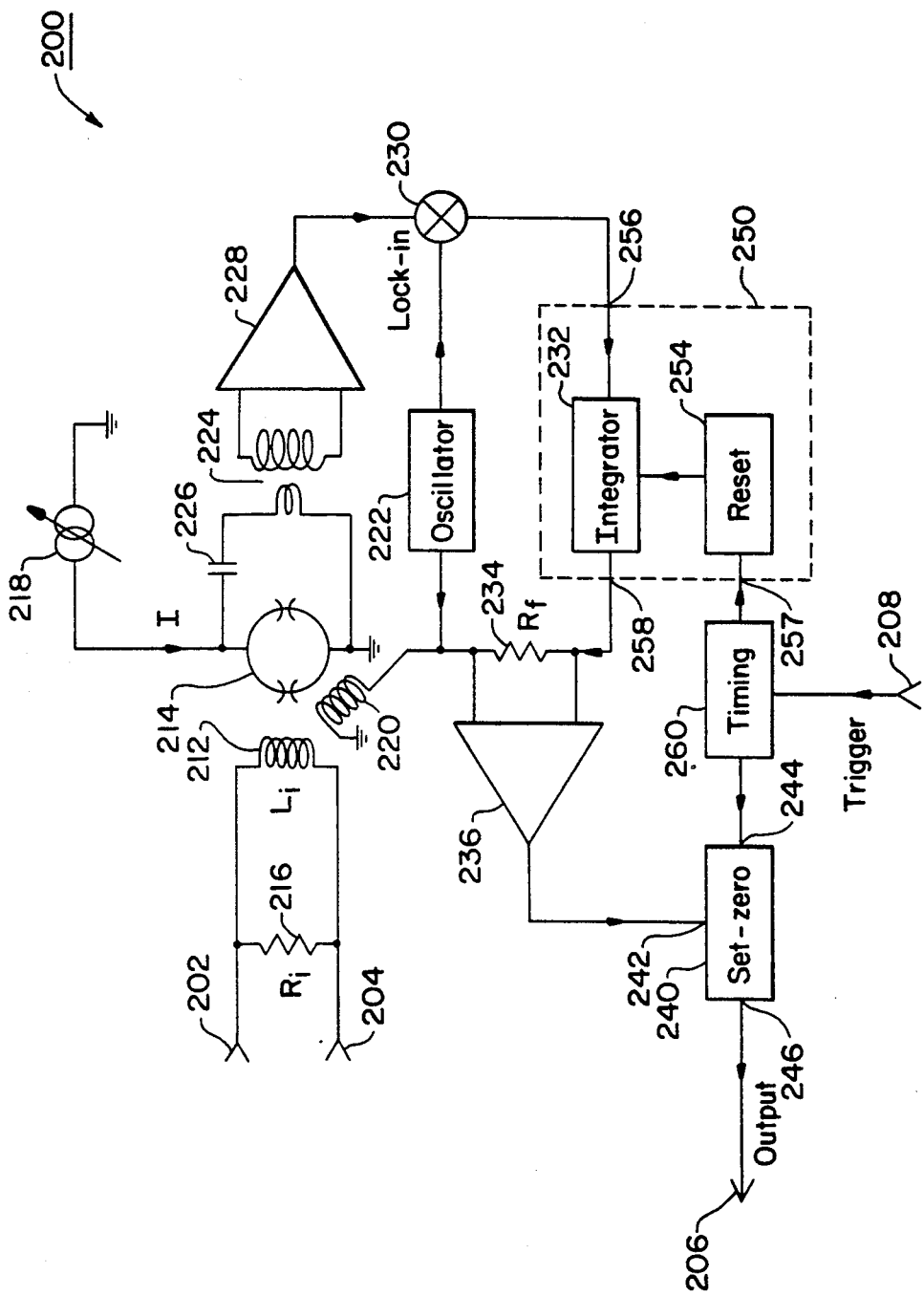
FIG. 2 is a schematic block diagram of a dc superconducting quantum interference device (SQUID) amplifier according to the present invention.

FIG. 1 is a schematic block diagram of a spectrometer 100 for detecting NMR and NQR according to the present invention. Spectrometer 100 comprises a time base 102, a cell 190, an excitation block 110, a SQUID amplifier 180, and a signal processing block 150. Time base 102 is used to provide timing sequences for the various trigger signals used in spectrometer 100. Cell 190 is used to house a sample 191, a transmitter coil 198, and a pick-up coil 197. The structure of an exemplary cell is shown in FIG. 6. Excitation block 110 generates a signal for coupling to transmitter coil 198. Transmitter coil 198 generates magnetic pulses in response to the signal generated by excitation block 110. Sample 191 generates NQR or ZFNMR signals which are received by pick-up coil 197. SQUID amplifier 180 amplifies the signal received by pick up coil 197. The block diagram of an exemplary SQUID amplifier is shown in FIG. 2. Signal processing block 150 processes the signal generated by SQUID amplifier 180.

Excitation block 110 comprises at least one function generator. In FIG. 1, two function generators, 122 and 124, are shown. One application where an arrangement having two function generators are needed is to detect the spin echo resonance generated by $^{14}N$ nuclei in the compound $NH_4ClO_4$ at 1.2K. Function generator 122 receives a trigger signal from time base 102 and generates a sinusoidal signal which preferably contains 1 to 30 cycles, starting at zero phase. Function generator 124, if present, receives a trigger signal from time base 102 preferably at a time different from the trigger signal for function generator 122. Function generator 124 also generates a sinusoidal signal.

The signals from function generators 122 and 124 are coupled to a power amplifier 126. The amplified signals are coupled to a low pass filter 128 which preferably cuts off signals below 300 kHz. The filtered signals pass through a pair of cross diodes 130, 132 to an input port 194 of cell 190. Preferably, three more stages of cross diodes are inserted between input port 194 and filter 128.

Transmitter coil 198 is coupled to input port 194 of cell 190. Consequently, the signals generated by excitation block 110 create magnetic pulses which are applied to the sample 191. Sample 191 generates a signal in response to the magnetic pulses which is received by pick-up coil 197. Pick-up coil 197 is coupled to output ports 195 and 196. The signal at output ports 195, 196 of cell 190 is coupled to the input ports 182, 184 of SQUID amplifier 180 for amplification. The amplified signal is coupled to signal processing block 150 through an output port 186 of SQUID amplifier 180. SQUID amplifier 180 also receives a trigger signal from time base 102 through an input port 188.

Signal processing block 150 comprises a band-pass filter 162, a digital oscilloscope 164 and spectrum analyzer 166. The signal at output port 186 of SQUID amplifier 180 is first coupled to band-pass filter 162 and then to digital oscilloscope 164 and a spectrum analyzer 166. Both digital oscilloscope 164 and spectrum analyzer 166 are triggered by signals from time base 102. Preferably, oscilloscope 164 is used for time-domain analysis and spectrum analyzer 166 is used for frequency-domain analysis.

The information processed by digital oscilloscope 164 and spectrum analyzer 166 is preferably stored in a computer (not shown). In addition, a computer is preferably used to control the parameters of function generators 122, 124, digital oscilloscope 164, and spectrum analyzer 166.

Function generators 122, 124 are preferably Hewlett Packard model 3314A. Time base 102, power amplifier 126, spectrum analyzer, and digital oscilloscope are preferably Stanford Research Systems DG535, ENI 1040L, Hewlett Packard 3561A, and Tektronix 2430A, respectively. However, other instruments can also be used.

FIG. 2 is a block diagram of a SQUID amplifier 200 according to the present invention. SQUID amplifier 200 comprises three input ports 202, 204, 208 and an output port 206. Ports 202, 204, 206, and 208 correspond to ports 182, 184, 186, and 188, respectively, in FIG. 1.

The input signal at input ports 202, 204, i.e. the signal received by pick-up coil 197 in FIG. 1, is coupled to an input coil 212. A resistor 216, preferably about 100 Ω, is in parallel with input coil 212. Resistor 216 provides a low pass filter to reduce the level of interference reaching a SQUID 214 at frequencies above 60 MHz. The inductance of input coil 212 is preferably the same as the inductance of pick-up coil 197. The value of the inductance of each coil 212, 197 is preferably 120 nH.

Input coil 212 is positioned close to the SQUID 214 for providing tight magnetic coupling. SQUID 214 is preferably fabricated in batches of thirty six on 50 mm-diameter oxidized silicon wafers. SQUID 214 comprises a square washer of niobium (Nb) with inner and outer dimensions of 0.2 and 0.9 mm. SQUID 214 further comprises Josephson junctions formed in a plasma discharge in Argon and 10% Oxygen. The preferred parameters of SQUID 214 are: critical current per junction, 5 μA; shunt resistance per junction, 8 Ω; and inductance of SQUID loop, 0.4 nH. The mutual inductance between input coil 212 and SQUID 214 is preferably 6 nH. SQUID 214 is biased by a current source 218.

SQUID 214, input coil 212, resistor 216, and pick-up coil 197, shown in FIG. 1, are set at liquid $^4$He temperature. Consequently, SQUID 214 is able to detect the changes in the magnetization of a sample at frequencies down to zero.

SQUID 214 is operated in a flux-locked loop, the detail of which is described below. The circuit configuration for a flux-locked loop is well known in the art. An example of a circuit configuration for a flux-locked loop and its principle of operation is described by Wellstood, et al. in Rev, Sci. Instrum., Vol. 55, No. 6, June 1984, pp. 952 et, seq.

A modulation feedback coil 220 is placed close to SQUID 214 for providing close magnetic coupling. Modulation feedback coil 220 has one end coupled to ground and the other end coupled to an oscillator 222. Oscillator 222 and modulation feedback coil 220 generate and couple a 500 kHz square wave modulation flux having a peak-to-peak magnitude of $\Phi_0/2$ to SQUID 214 The symbols $\Phi_0=h/2e$ designate the flux quantum, where h is the Planck's constant and e is the electron charge. The mutual inductance between modulation feedback coil 220 and SQUID 214 is preferably 0.1 nH.

SQUID 214 converts the modulation flux to an oscillating square wave voltage signal having a frequency of 1 MHz. The voltage signal is coupled to a transformer 224 through a capacitor 226. The turns ratio of transformer 224 is preferably 15 so that the voltage signal from SQUID 214 is amplified by transformer 224. The voltage is further amplified by amplifier 228 before being coupled to a mixer 230 for lock-in detection.

Mixer 230 also accepts input from oscillator 222 for generating a lock-in signal. The lock-in signal is coupled to an integrator 232. The output from integrator 232 is coupled to modulation feedback coil 220 through a feedback resistor 234, preferably 5 k$\Omega$.

The lock-in signals from mixer 230, described above, have zero average value when input coil 212 does not generate magnetic flux. Consequently, the voltage across feedback resistor 234 is approximately zero. If input coil 212 causes any variation in flux, preferably of value less than $\Phi_o$, coupled to SQUID 214, the voltage signal generated by SQUID 214 has a component having magnitude and phase depending on the magnitude and sign of the variation. When this component passes through capacitor 226, transformer 224, amplifier 228, mixer 230, and integrator 232, there will be nonzero average output at integrator 232 which is proportional to the variation in flux. This output from integrator 232 is fed back to modulation feedback coil 220 through resistor 234.

The signal across resistor 234, caused by magnetic flux generated by input coil 212, induces a voltage which is proportional to the variation in flux. This voltage is amplified by an amplifier 236. The output of amplifier 236 is coupled to an input port 242 of a set-zero circuit 240, shown in FIG. 4, to adjust the voltage to a proper level. The adjusted voltage is coupled out of set-zero circuit 240 at an output port 246 and then coupled to output port 206 of SQUID amplifier 200. A timing signal is coupled from timing circuit 260 to set-zero circuit 240 through an input port 244.

The flux-locked feedback circuit, described above, would not work properly if the changes in flux exceed the slew rate of the loop. In the spectrometer according to the present invention, a large magnetic pulse is applied to the sample, as was noted above, Despite efforts to isolate SQUID 214 from the magnetic pulse, a fraction of the pulse is coupled to SQUID 214. Such a pulse could result in integrator 232 being driven into saturation. After the magnetic pulse is turned off, integrator 232 would remain saturated for a long period of time. As a result, the flux-locked feedback circuit could not detect the change in flux during the period when integrator 232 is in a saturated stage.

Figure 3:
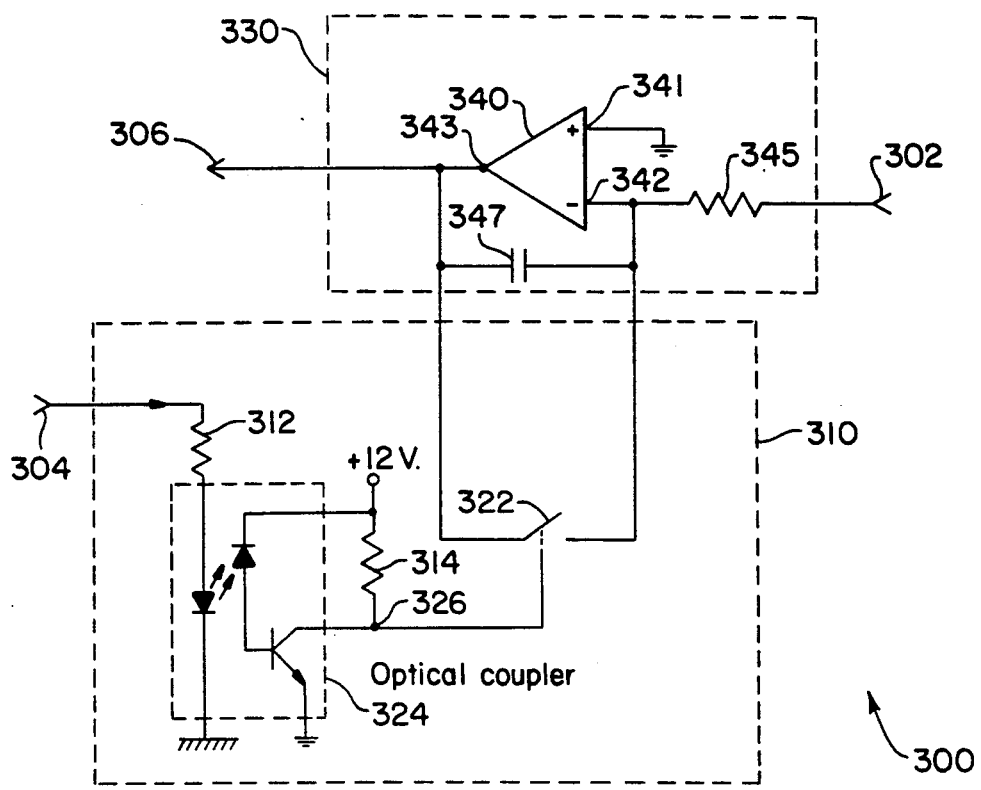
FIG. 3 is a schematic block diagram of an improved integrator according to the present invention.

The SQUID amplifier according to the present invention solves the saturation problem by using an improved integrator 250. An exemplary improved integrator is shown in FIG. 3. Improved integrator 250 comprises a reset circuit 254 attached to a conventional integrator 232. As is explained below, reset circuit 254 prevents conventional integrator 232 from operating as an integrator at the appropriate time by shorting out an integrating capacitor in integrator 232. Improved integrator 250 further comprises an input port 256 for accepting a signal from mixer 230, an input port 257 for accepting a pulse signal from a timing circuit 260, and an output port 258 for coupling the output signal to resistor 234.

Figure 5:
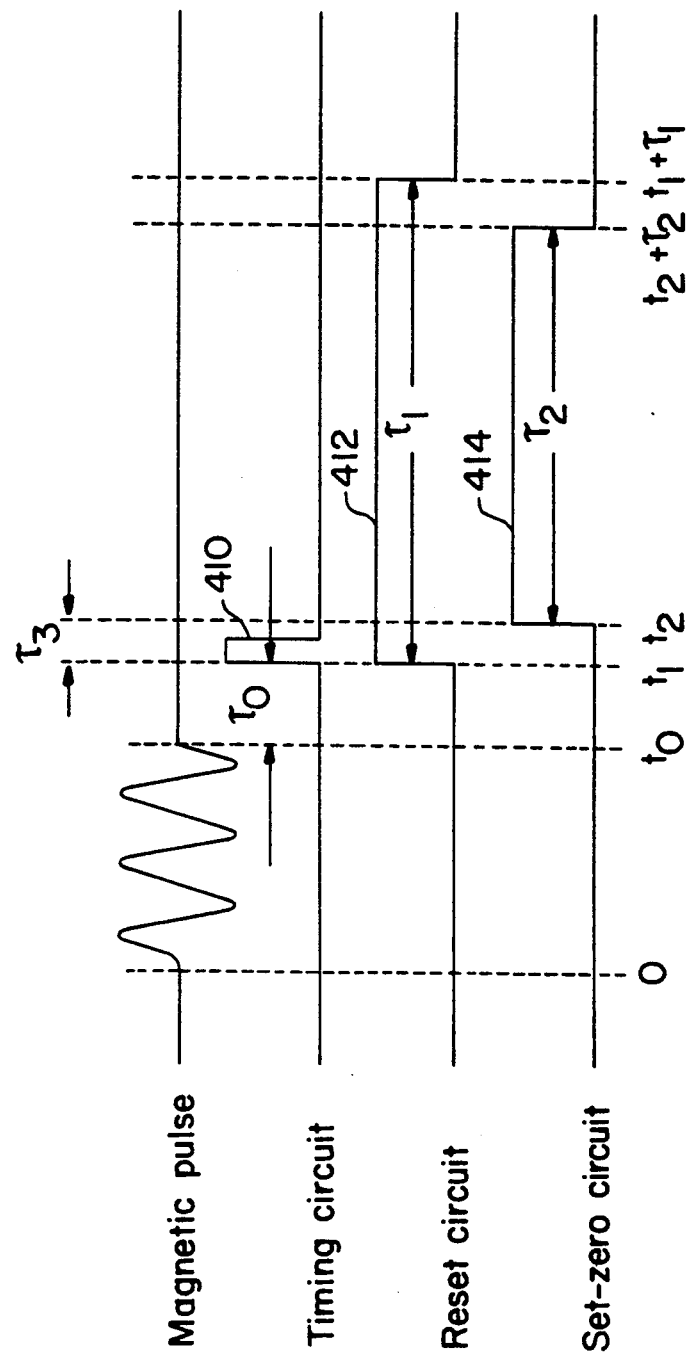
FIG. 5 is a timing diagram showing the timing sequences of the magnetic pulse signal and selected signals in a dc SQUID amplifier according to the present invention.

Timing circuit 260 accepts a trigger signal from input port 208 of SQUID amplifier 200 and generates two TTL pulses. One pulse is coupled to reset circuit 254 and the other pulse is coupled to set-zero circuit 240. The timing diagram of these pulses is shown in FIG. 5. A circuit suitable for generating two TTL pulses from a trigger signal is conventional and is well known in the art.

FIG. 3 is a schematic block diagram of an improved integrator 300 according to the present invention. Improved integrator 300 comprises two input ports 302, 304, and an output port 306. Ports 302, 304, and 306 correspond to ports 256, 257, and 258, respectively, in FIG. 2.

Improved integrator 300 further comprises a reset circuit 310 and a conventional integrator section 330, corresponding to reset circuit 254 and integrator 232 as in FIG. 2. Conventional integrator section 330 comprises a resistor 345, an integrating capacitor 347, and an amplifier 340 having a noninverting terminal 341, an inverting terminal 342, and an output terminal 343. Resistor 345 is coupled between input port 302 of improved integrator 300 and inverting terminal 342 of amplifier 340. Capacitor 347 is coupled between inverting terminal 342 and output terminal 343 of amplifier 340 for integrating the signal at input terminal 342. Noninverting terminal 341 of amplifier 340 is coupled to ground. It is well known in the art that the arrangements of capacitor 347, resistor 345, and amplifier 340, described above, function as an integrator.

Reset circuit 310 comprises two resistors 312, 314, a switch 322, and an optical coupler 324. An optical coupler is a device, well known in the art, for isolating the output from the input. Preferably, it is a 6N135 manufactured by Hewlett Packard. Switch 322 should has a fast switching time, and is preferably a FET linear switch, DG 308 manufactured by Siliconix.

A control pulse, preferably of TTL signal level, for controlling the reset of conventional integrator section 330 is coupled to input port 304. Resistor 312 coupled between input port 304 and optical coupler 324 allows an appropriate current flowing to optical coupler 324. This current, in the form of a pulse, is coupled by optical coupler 324 to node 326. Resistor 314 provides a load to optical coupler 324 so that the voltage at node 324 is a voltage pulse having substantially the same shape as the control pulse at input port 304.

Node 326 is coupled to switch 322 for controlling switch 322. The control pulse is timed so that switch 322 is closed during the turning on of the magnetic excitation pulse and open shortly after the magnetic excitation pulse is turned off. When switch 322 is closed, capacitor 347 is in a short circuit so that no charge can be stored, thereby defeating the integrating action of conventional integrator section 330. When switch 322 is open, conventional integrator section 330 is able to operate in a conventional manner as an integrator.

Figure 4:
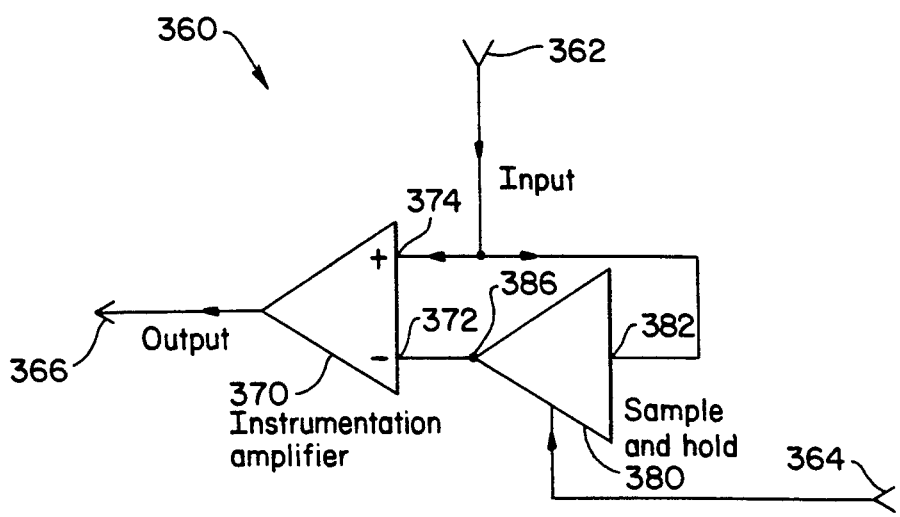
FIG. 4 is a block diagram of a set-zero circuit according to the present invention.

FIG. 4 is a block diagram of a set-zero circuit 360 according to the present invention. Set-zero circuit 360 comprises two input ports 362, 364 and an output port 366. Ports 362, 364, and 366 correspond to ports 242, 244, and 246 in FIG. 2.

Set-zero circuit 360 further comprises an instrumentation amplifier 370 and a sample and hold (S/H) device 380. Instrumentation amplifier 370 functions as a unity gain amplifier.

S/H device 380 can either be in a sample mode wherein the output is substantially the same as the input or in a hold mode wherein the output is substantially a constant value equal to the value of the input at the initiation of the hold mode. The mode of S/H device 380 is controlled by a signal, preferably of TTL voltage level, at input port 364.

Input signal from port 362 is coupled to an input terminal 382 of S/H device 380 and an input terminal 374 of instrumentation amplifier 370. The output terminal 386 of S/H device 380 is coupled to an input terminal 372 of instrumentation amplifier 370. During the sample mode, the signal levels at the terminals 382, 386 of S/H device 380 and terminals 372, 374 of instrumentation amplifier 370 are substantially the same. Since the input at the two input terminals 372, 374 of instrumentation amplifier 370 are substantially the same, the output of instrumentation amplifier 370 is approximately equal to zero. During the hold mode, the signal at output terminal 386 of S/H device 380 is substantially equal to the value of the input at port 362 at the commencement of the hold action. Thus, the output of instrumentation amplifier 370 is substantially equal to the difference between the present value of the input signal and the value of the input signal at the commencement of the hold action. This signal difference is coupled to output port 366 of set-zero circuit 360.

In operation, before the flux-locked loop reaches stable operation, S/H device 380 is in the sample mode. As a result, the signal at output port 366 of set-zero circuit 360 is approximately zero. When the flux-locked loop reaches stable operation, it produces a large voltage step at the output reflecting the feedback current necessary to flux-lock SQUID 214 of FIG. 2. In order to cancel this voltage step while the spectra is being recorded, S/H device 380 is switched into a hold mode. Consequently, the voltage level of output terminal 386 of S/H device 380 is held at the level of the voltage step. As a result, the output voltage of instrumentation amplifier 370 is substantially equal to the difference between the voltage at input port 362 and the voltage step. This difference is proportional to the variation in flux sensed by SQUID 214.

FIG. 5 is a timing diagram showing the timing sequences of the magnetic pulse signal and the signals at ports 244 and 257 of set-zero circuit 240 and reset circuit 254, respectively. At time $t=0$, the magnetic pulse to the sample is turned on. The magnetic pulse is turned off at time $t_o$. During this time, switch 322, shown in FIG. 3, is closed so that integrator 330, shown in FIG. 3, is disabled. The S/H device 380, shown in FIG. 4, is set to a sample mode so that the output from set-zero circuit 360, shown in FIG. 4, is zero. Even though the magnetic pulse is turned off at time $t_o$, the residual signal induced by the pulse still changes too rapidly for the flux-locked loop to follow. After a further time $\tau_0$, the time derivative of the residual signal is smaller than the slew rate of the flux-locked loop. Consequently, at time $t_1 = t_0 + \tau_0$, a trigger pulse 410 is sent to timing circuit 260, shown in FIG. 2, which produces two pulses 412, 414. Pulse 412 is used to set switch 322, shown in FIG. 3, to an open state so that so that integrator 330, shown in FIG. 3, operates as a conventional integrator. Pulse 412 starts at time $t_1$ and has a length of $\tau_1$. Pulse 414 is used to set S/H device 380, shown in FIG. 4, to a hold mode. Pulse 414 starts at $t_2$, a short time $\tau_3$ after $t_1$ and has length $\tau_2$. At time $t_2$, data collection begins.

Preferably, $\tau_0$ is 20 $\mu$s for a magnetic pulse with peak-to-peak value of 0.1 mtesla, and about 80 $\mu$s for a peak-to-peak value of 10 mtesla. Preferably $\tau_3$ is 20 $\mu$s because the flux-locked loop settles into stable operation within 20 $\mu$s.

Figure 6B:
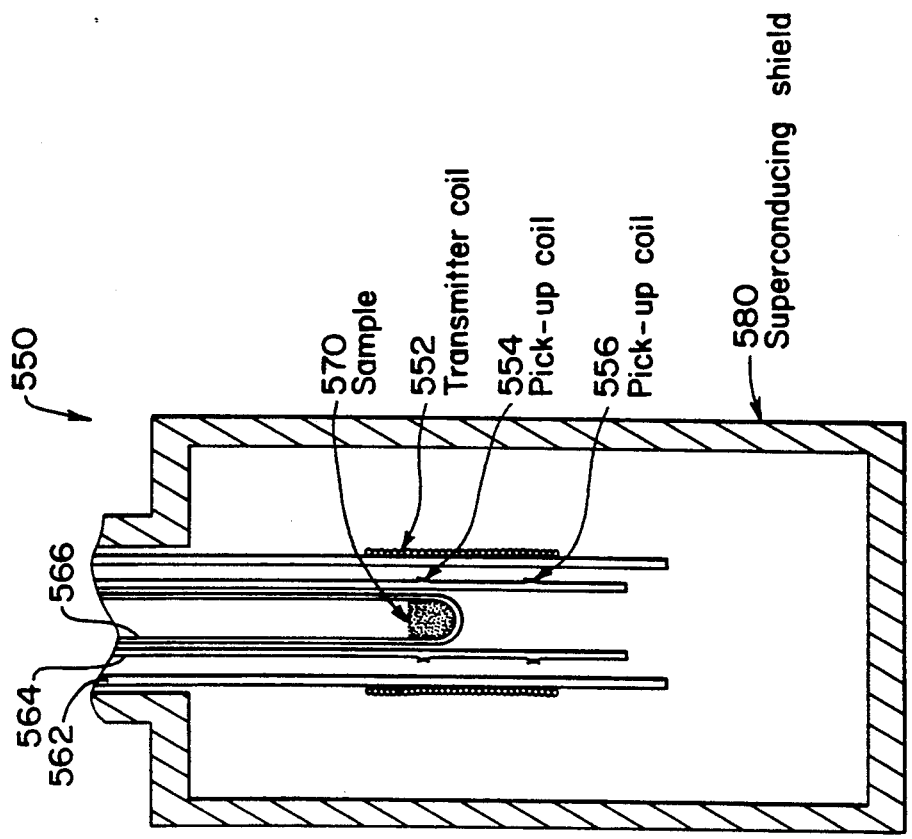
FIG. 6B is a cross sectional view of an exemplary low frequency nuclear quadrupole resonance and zero-field nuclear magnetic resonance cell according to the present invention.
Figure 6A:
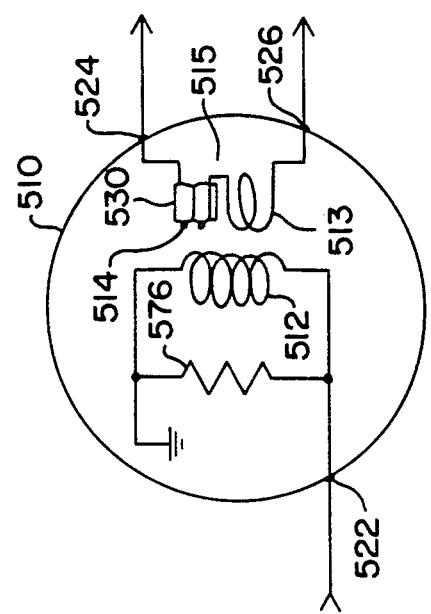
FIG. 6A is a schematic diagram of an exemplary low frequency nuclear quadrupole resonance and zero field nuclear magnetic resonance cell according to the present invention.

FIG. 6A shows a schematic diagram of an exemplary low frequency NQR and ZFNMR cell 510 and FIG. 6B shows a cross sectional view of an exemplary low frequency NQR and ZFNMR cell 550 according to the present invention. Cell 510 of FIG. 6A comprises an input port 522 and two output ports 524 and 526. Ports 522, 524, and 526 correspond to ports 194–196 of FIG. 1.

Cell 510 further comprises a transmitter coil 512 and a resistor 516. Transmitter coil 512 and resistor 516 have one end coupled to input port 522 and the other end coupled to ground.

Cell 510 also comprises a pick-up coil 515 having two oppositely wound coils 513, 514 coupled to the output ports 526, 524, respectively. A sample 530 is placed inside one of the coils, say, coil 514.

Cell 550 in FIG. 6B comprises a cylindrical superconducting shield 580, preferably having internal length and diameter of 130 mm and 30 mm, respectively. The wall of shield 580 is preferably machined from a solid cylinder of lead and having a thickness of 3 mm.

Cell 550 is immersed in liquid helium in a cryostat (not shown) surrounded by a double mu-metal shield. A probe on which the SQUID is mounted is placed inside another tube and is also immersed in liquid helium temperature. The whole assembly rests on a vibration-isolation table to minimize microphonic noise. The cryostat and SQUID electronics, described above, are in a shielded room, while the remaining electronics are outside this room, to eliminate spurious digital noise.

Cell 550 further includes a pickup coil comprising coils 554, 556. Each one of coils 554, 556 has two turns of 125 $\mu$m diameter insulated niobium (Nb) wire. Coils 554, 556 are wound in opposition direction 15 mm apart on a 8.5 diameter quartz tube 564. Quartz tube 564 is rigidly held by spacers (not shown). The total inductance of the pair of coils 554, 556 is approximately 150 nH. The leads of coils 554, 556 are twisted together, glued to quartz tube 564 and brought out of cell 550 into a second lead cell containing the SQUID (not shown).

Transmitter coil comprises a 30 mm long, single layer solenoid wound from 225 $\mu$m diameter Nb wire on a quartz tube 562 with an outer diameter of about 14 mm. The relative positions of pickup coils 554, 556 and transmitter coil 552 are adjusted empirically to achieve a balance of about 0.5% in the pickup gradiometer.

A sample 570, preferably having a volume of 0.5 ml, is packed into a 8 mm diameter pyrex NMR tube 566. Tube 566 is inserted into the middle of pick-up coil 554 through an O-ring seal at the top of the cryostat.

As can be seen from the above description of cell 510, it has a clean and well defined structure. It is believed that this structure could contribute to the reduced noise. It is also believed that the use of quartz tubes for supporting the winding of the coils may also play a role in reducing noise. It is also believed that the pair of oppositely wound coils 554, 556 allows cancellation of noise.

Another feature of the construction according to the present invention is that the temperature of the sample can be different from the temperature of the cryostat. The pyrex tube 566 used in FIG. 6 could have a vacuum wall thereby thermally isolating the sample from cell 550. As a result, it is possible to study the variation of the low frequency NQR spectra of a sample as a function of its temperature.

Various modifications of the invention, in addition to those shown and described herein, will be apparent to those skilled in the art from the foregoing description and accompanying drawings. Such modifications are intended to fall within the scope of the appended claims.

What is claimed is:

1. A dc SQUID amplifier comprising:
 a SQUID for generating a signal as a function of an applied magnetic flux;
 an oscillator for generating a oscillatory signal;
 a modulating feedback coil having a first end coupled to ground and a second end coupled to said oscillator, said modulating feedback coil generating an oscillatory magnetic flux for coupling to said SQUID;
 mixer means coupled to said oscillator and said SQUID for generating a lock-in-signal;
 integrator means for generating an integrated signal as a function of said lock-in signal;
 means for coupling said integrated signal to said second end of said modulating feedback coil; and
 means for preventing said integrator from saturation.

2. The dc SQUID amplifier according to claim 1 wherein said integrator includes an integrating capacitor having a first and a second end, and, wherein said means for preventing comprises:
 a switch coupled to said first and said second end of said integrating capacitor, said switch having a closed and an open state, said integrating capacitor being short circuited when said switch is in said closed state thereby disabling said integrator, said integrator being enabled when said switch is in said open state; and
 means for generating a control signal for setting the state of said switch, said switch being set to said open state after a first predetermined length of time after the termination of said oscillatory signal, said switch being kept at said open state for a second predetermined length of time, said switch being set to said closed state at other times.

* * * * *